US012671368B2

(12) United States Patent
Scott et al.

(10) Patent No.: US 12,671,368 B2
(45) Date of Patent: Jun. 30, 2026

(54) AMPLITUDE MODULATION-PHASE MODULATION (AM-PM) LINEARIZATION IN A POWER AMPLIFIER USING BIAS CIRCUITRY

(71) Applicant: Qorvo US, Inc., Greensboro, NC (US)

(72) Inventors: Baker Scott, San Jose, CA (US); George Maxim, Saratoga, CA (US)

(73) Assignee: Qorvo US, Inc., Greensboro, NC (US)

( * ) Notice: Subject to any disclaimer, the term of this patent is extended or adjusted under 35 U.S.C. 154(b) by 1018 days.

(21) Appl. No.: 17/659,217

(22) Filed: Apr. 14, 2022

(65) Prior Publication Data

US 2023/0336128 A1 Oct. 19, 2023

(51) Int. Cl.
H03F 1/22 (2006.01)
H03F 1/32 (2006.01)
H03F 3/24 (2006.01)

(52) U.S. Cl.
CPC ........... H03F 1/3205 (2013.01); H03F 3/245 (2013.01); H03F 2200/451 (2013.01)

(58) Field of Classification Search
CPC ........................................................ H03F 1/22
USPC .................................................. 330/311, 310
See application file for complete search history.

(56) References Cited

U.S. PATENT DOCUMENTS 6,292,060 B1      9/2001   Yeo et al.
6,803,824 B2 *  10/2004   Rategh ................. H03G 1/0029
                                                                      330/311

6,850,120 B2 *    2/2005   Heima ..................... H03F 1/223
                                                                      330/285
7,276,976 B2 *  10/2007   Oh ........................... H03F 1/301
                                                                      330/311
7,295,064 B2     11/2007   Shiikuma et al.
7,741,910 B2 *    6/2010   Wong .................... H03F 3/3022
                                                                      330/311
7,821,349 B2     10/2010   Park et al.
8,111,104 B2 *    2/2012   Ahadian ................. H03F 1/223
                                                                      330/311
8,120,428 B2 *    2/2012   Montalvo .............. H03F 1/223
                                                                      330/311

(Continued)

FOREIGN PATENT DOCUMENTS

EP          2618481 A1      7/2013

OTHER PUBLICATIONS

U.S. Appl. No. 17/659,221, filed Apr. 14, 2022.

(Continued)

*Primary Examiner* — Henry Choe
(74) *Attorney, Agent, or Firm* — Withrow & Terranova, P.L.L.C.

(57) ABSTRACT

Amplitude modulation-phase modulation (AM-PM) linearization in a power amplifier using bias circuitry, which fixes a bias of a cascode transistor within a power amplifier is disclosed. In particular, the cascode transistor may switch between operation in a saturation mode and a triode mode. The bias is set such that the cascode transistor operates at a fixed duty cycle in the triode mode relative to the saturation mode for a wide range of signal levels from small-signal to large-signal. An exemplary duty cycle is fifty percent (50%), although other duty cycles may be used. This bias will result in a constant capacitance contributed by the cascode device to the power amplifier over a wide signal level range.

20 Claims, 8 Drawing Sheets

(56) References Cited

U.S. PATENT DOCUMENTS

| | | | |
|---|---|---|---|
| 8,493,154 B1 * | 7/2013 | Camargo | H03F 3/195 |
| | | | 330/296 |
| 8,648,656 B2 * | 2/2014 | Nozaki | H03G 1/0029 |
| | | | 330/311 |
| 8,686,796 B2 | 4/2014 | Presti | |
| 8,779,860 B2 * | 7/2014 | Jeon | H03F 1/223 |
| | | | 330/311 |
| 8,847,689 B2 * | 9/2014 | Zhao | H03F 3/189 |
| | | | 330/285 |
| 9,362,872 B2 | 6/2016 | Park et al. | |
| 9,413,309 B1 | 8/2016 | Zhao et al. | |
| 9,621,110 B1 | 4/2017 | Boyavalle et al. | |
| 10,020,780 B2 | 7/2018 | Shimura | |
| 11,711,057 B2 | 7/2023 | Lehtola | |
| 2003/0193371 A1 | 10/2003 | Larson et al. | |
| 2011/0037519 A1 | 2/2011 | Pletcher et al. | |
| 2011/0304395 A1 | 12/2011 | Koo et al. | |
| 2012/0146722 A1 | 6/2012 | Scott et al. | |
| 2013/0154744 A1 | 6/2013 | Samavedam et al. | |
| 2013/0176077 A1 | 7/2013 | Pai et al. | |
| 2016/0173036 A1 | 6/2016 | Vogt et al. | |
| 2017/0207758 A1 | 7/2017 | Tseng et al. | |
| 2020/0007088 A1 | 1/2020 | Ranta et al. | |
| 2022/0078051 A1 | 3/2022 | Siddamurthy et al. | |
| 2023/0163734 A1 | 5/2023 | Scott et al. | |
| 2023/0318537 A1 | 10/2023 | Scott et al. | |
| 2023/0336127 A1 | 10/2023 | Scott et al. | |

OTHER PUBLICATIONS

U.S. Appl. No. 17/706,985, filed Mar. 29, 2022.

Sowlati, T. et al., "A 2.4-GHz 0.18-μm CMOS Self-Biased Cascode Power Amplifier," IEEE Journal of Solid-State Circuits, vol. 38, No. 8, Aug. 2003, IEEE, pp. 1318-1324.

Extended European Search Report for European Patent Application No. 23165650.5, mailed Sep. 7, 2023, 12 pages.

Fu, J. et al., "A 2.4G-Hz CMOS Power Amplifier," 2010 10th IEEE International Conference on Solid-State and Integrated Circuit Technology, Nov. 1-4, 2010, Shanghai, China, IEEE, 3 pages.

Non-Final Office Action for U.S. Appl. No. 17/659,221, mailed Oct. 30, 2024, 8 pages.

Extended European Search Report for European Patent Application No. 23161975.0, mailed Aug. 31, 2023, 15 pages.

* cited by examiner

AMPLITUDE MODULATION-PHASE MODULATION (AM-PM) LINEARIZATION IN A POWER AMPLIFIER USING BIAS CIRCUITRY

FIELD OF THE DISCLOSURE

The technology of the disclosure relates generally to power amplifiers and, more particularly, to power amplifiers with separate transconductance and transimpedance devices that may need improved phase linearity across multiple power levels.

BACKGROUND

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. The advent of the fifth generation-new radio (5G-NR) cellular standards, and particularly the use of millimeter wave signals creates challenges for power amplifiers used in the transmission chains of such mobile communication devices. Accordingly, there is room for innovation for the power amplifiers.

SUMMARY

Aspects disclosed in the detailed description include amplitude modulation-phase modulation (AM-PM) linearization in a power amplifier using bias circuitry. In particular, exemplary aspects of the present disclosure provide a bias circuit which fixes a bias of a cascode transistor within a power amplifier. In particular, the cascode transistor may switch between operation in a saturation mode and a triode mode. The bias is set such that the transistor operates at a fixed duty cycle in the triode mode relative to the saturation mode. An exemplary duty cycle is fifty percent (50%), although other duty cycles may be used. This bias will result in a constant capacitance contributed to the power amplifier over a wide signal level range. This constant capacitance results in negligible phase distortion of the signal being amplified by the power amplifier due to the cascode devices. Such a small phase distortion is more readily corrected resulting in better overall performance and user experience.

In this regard in one aspect, a power amplifier stage is disclosed. The power amplifier stage comprises a cascode transistor comprising a gate. The power amplifier stage also comprises a bias circuit coupled to the gate. The bias circuit is configured to hold a voltage level between the gate and a drain equal to a device threshold voltage of the cascode transistor.

In another aspect, a radio frequency (RF) circuit is disclosed. The RF circuit comprises a cascode power amplification stage comprising a cascode gate and an output node. The RF circuit also comprises a threshold voltage bias stage matched to the cascode power amplification stage and configured to keep the cascode gate within one threshold voltage from a direct current (DC) voltage level of the output node such that the cascode power amplification stage is at a verge of entering a triode operation.

In another aspect, a power amplifier stage is disclosed. The power amplifier stage comprises a cascode transistor comprising a gate. The power amplifier stage also comprises a bias circuit coupled to the gate. The bias circuit is configured to hold a voltage level at the gate to a drain voltage modified by a threshold.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1B:
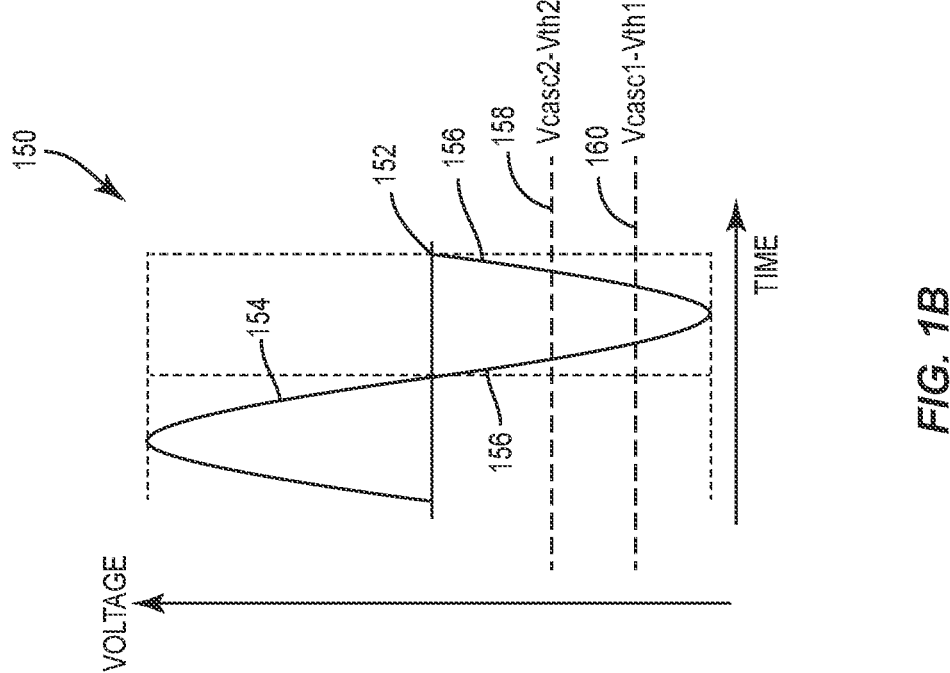
FIG. 1B is a graph of a power swing versus time showing where the cascode transistors typically crush during operation.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include amplitude modulation-phase modulation (AM-PM) linearization in a power amplifier using bias circuitry. In particular, exemplary aspects of the present disclosure provide a bias circuit which fixes a bias of a cascode transistor within a power amplifier. In particular, the cascode transistor may switch between operation in a saturation mode and a triode mode. The bias is set such that the transistor operates at a fixed duty cycle in the triode mode relative to the saturation mode. An exemplary duty cycle is fifty percent (50%), although other duty cycles may be used. This bias will result in a constant capacitance contributed to the power amplifier over a wide signal level range. This constant capacitance results in negligible phase distortion of the signal being amplified by the power amplifier due to the cascode devices. Such a small phase distortion is more readily corrected resulting in better overall performance and user experience.

Before addressing particular exemplary aspects of the AM-PM linearization, a brief overview of a source of a phase change is discussed with reference to FIGS. 1A and 1B. This induced phase change leads to non-linear phase behavior, which, if uncorrected, decreases efficiency and may lead to operation that does not comply with relevant wireless protocols. A discussion of exemplary aspects of the present disclosure begins below with reference to FIG. 2.

Figure 1A:
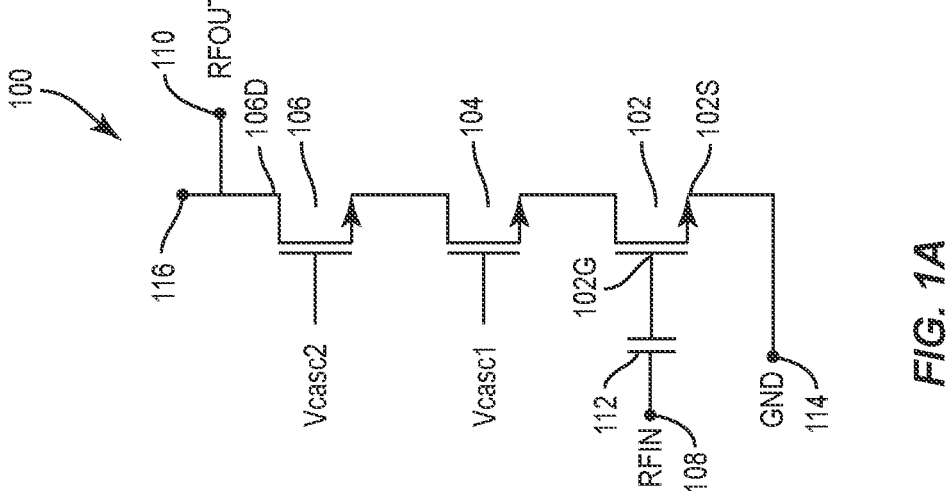
FIG. 1A is a circuit diagram of an exemplary conventional cascode power amplifier stage.

In this regard, FIG. 1A is circuit diagram of a power amplifier stage 100 formed from a transconductance device 102, a middle cascode device 104, and a top cascode transistor 106. As illustrated, the transconductance device 102, the middle cascode device 104, and the top cascode transistor 106 are formed from n-type field effect transistors (FETs) (NFETs). A signal to be amplified (e.g., RFIN) is provided at an input node 108 and an amplified signal (RFOUT) is provided at an output node 110. RFIN may pass through a blocking capacitor 112 to a gate 102G of the transconductance device 102. In an alternate embodiment the input signal may be a direct current (DC) signal and coupled directly to the input node 108. The transconductance device 102 provides the primary amplification to RFIN. The middle cascode device 104 and the top cascode transistor 106 are both cascodes relative to the transconductance device 102. A source 102S of the transconductance device 102 may be coupled to a ground 114, and a drain 106D of the top cascode transistor 106 may be coupled to the output node 110 and a supply voltage 116.

In normal use, the transconductance device 102, the middle cascode device 104, and the top cascode transistor 106 operate in a saturation mode. However, at large voltages going towards the peak negative voltages, these devices may be "crushed" or enter a triode mode. This crushing occurs when the drain voltage of a given cascode is less than the gate voltage by more than a device threshold voltage. This concept is better illustrated by graph 150 in FIG. 1B, where the amplifier device 100 operates around a direct current (DC) voltage level 152. The transconductance device 102, the middle cascode device 104, and the top cascode transistor 106 operate in the saturation mode as long as the voltage level of RFOUT is above the DC voltage level 152 (generally shown by curve 154). Likewise, so long as curve 156 is above line 158, the transconductance device 102, the middle cascode device 104, and the top cascode transistor 106 operate in the saturation mode. However, at line 158, the drain voltage of the top cascode transistor 106 is more than a threshold Vth2 below the voltage of the gate terminal of the top cascode transistor 106, and the top cascode transistor 106 crushes (i.e., enters a triode mode of operation). The saturation to triode mode transition changes the capacitance of the cascode device in a non-linear manner, which results in significant phase distortion. Likewise, when RFOUT passes below line 160, the drain voltage of the middle cascode device 104 is more than a threshold Vth1 below the voltage of the gate voltage of the middle cascode device 104, and the middle cascode device 104 crushes (i.e., enters a triode mode of operation). The saturation to triode mode transition of the middle cascode device results in additional phase distortion due to the non-linear cascode device capacitance change.

When the transistors crush in this fashion, the parasitic capacitance changes, which in turn creates or changes the phase versus power characteristic, resulting in phase distortion imposed on the amplified signal by the power amplifier stage 100. That is, the cascode devices of an amplifier will contribute a variable and non-linear capacitance loading to the signal path of the amplifier. This variable capacitance induces a phase change that leads to non-linear phase behavior as a function of signal level, which constitutes amplitude modulation-to-phase modulation (AM-PM) distortion. Such changing phase distortion introduces non-linearities which are hard to correct and degrade performance, ultimately negatively impacting user experience.

Past solutions might use additional circuitry that could consume additional power, thus decreasing the efficiency of the amplifier (and may potentially lead to operation that does not comply with relevant wireless protocols). Alternatively, another past solution might change the size of the cascode devices to reduce its parasitic capacitance, and then operate backed off of the peak so as to avoid crushing the transistors. This requires a larger voltage headroom and thus causes higher power dissipation. Such approach is inefficient and a poor use of the limited space within the overall device.

Exemplary aspects of the present disclosure accept that the transistors will crush and operate in a triode mode. Rather than try to avoid such situation, exemplary aspects of the present disclosure control the crushing to a fixed duty cycle. While the instantaneous capacitance may vary over a large range, the averaged per cycle capacitance shows a much-reduced variation due to the averaging effect, i.e., essentially constant average capacitance. This fixed duty cycle creates a constant average capacitance for the cascode transistor for all signal power levels, which in turn provides a constant phase. There may still be a small phase distortion contributed by the main transconductance device. Such small phase distortion is more amenable to correction such as through predistortion.

Crushing occurs when the voltage at a gate (Vg) of a transistor is higher than the voltage at a drain (Vd) by some known device threshold value (Vth). To control the crushing of the transistor, a bias circuit is provided which sets the gate of a transistor at Vout(DC)+Vth where Vout(DC) is the voltage at the output (typically the drain of a FET) and Vth is a threshold voltage of the device. In an exemplary aspect, the bias is set such that at the quiescent point (i.e., no RF signal), the cascode transistor is right on the verge of entering the triode mode. The bias circuit of the present disclosure may match and track the Vth for the device, such as through replica biasing techniques, using a device that matches in type and is proportional in size with a device in the signal path. The two devices may also be placed in close proximity or even in the same diffusion, to reduce device-to-device mismatch, temperature mismatch, or the like. Setting the quiescent point in this manner will set the duty cycle at 50%. Other duty cycles may be chosen by changing the offset (or threshold difference) between the gate and drain, although such offset needs to be kept constant for all power levels.

Figures 2, 3:
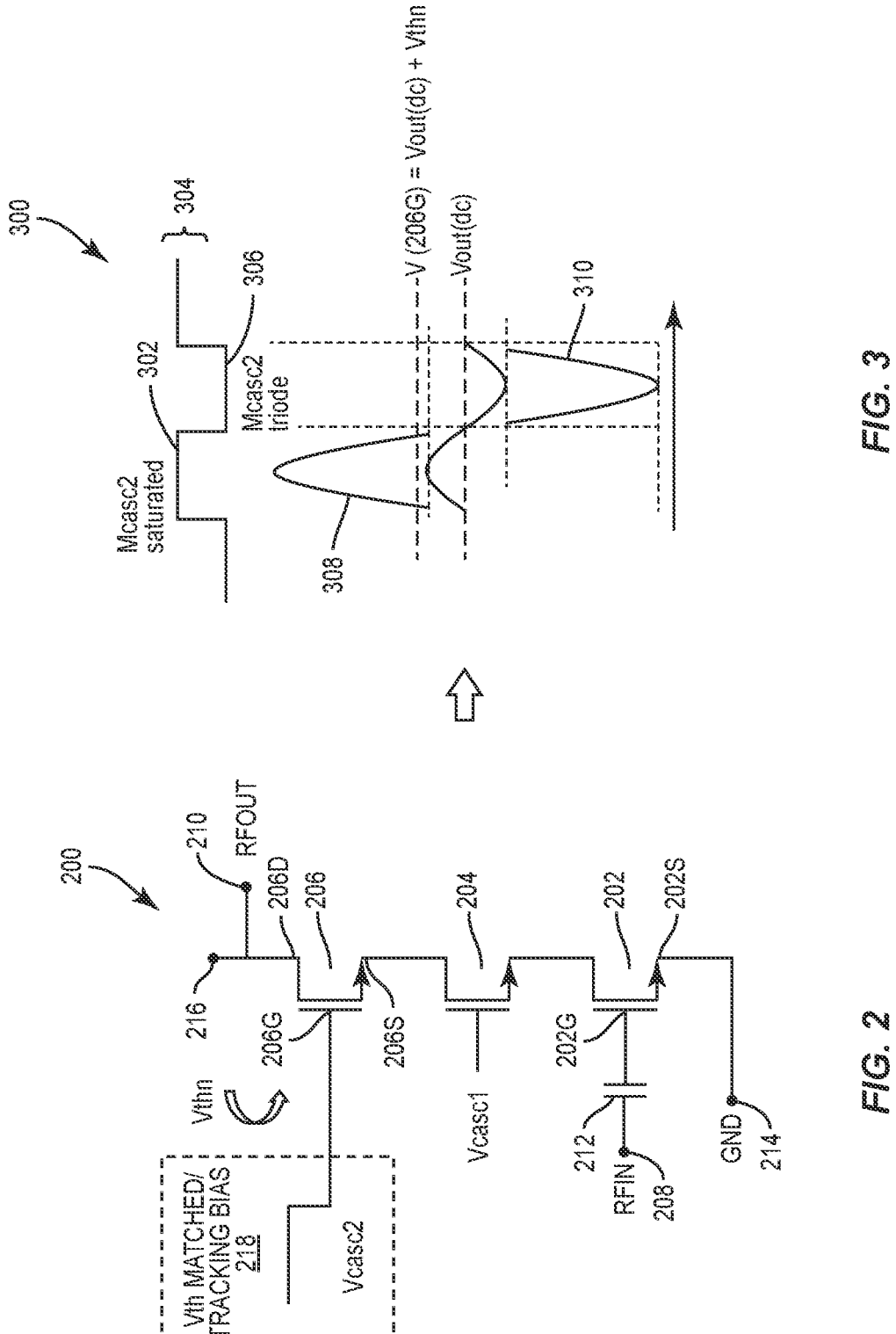
FIG. 2 is a circuit diagram showing a power amplifier stage having a bias circuit that fixes a bias level for an N-type cascode transistor within the power amplifier stage.
FIG. 3 is a graph of the output signal for the power amplifier stage with a fixed duty cycle achieved by the bias circuit of FIG. 2.

In this regard, FIG. 2 illustrates a first power amplifier stage 200 that has NFETs. A P-type example is provided below with reference to FIG. 4, and a complementary device is provided below with reference to FIG. 6. The power amplifier stage 200 is formed from a transconductance device 202, a middle cascode device 204, and a top cascode transistor 206. As illustrated, the transconductance device 202, the middle cascode device 204, and the top cascode transistor 206 are formed from NFETs. A signal to be amplified (e.g., RFIN) is provided at an input node 208 and an amplified signal (RFOUT) is provided at an output node 210. RFIN may pass through a blocking capacitor 212 to a gate 202G of the transconductance device 202. The transconductance device 202 provides the primary amplification to RFIN. The middle cascode device 204 and the top cascode transistor 206 are both cascodes relative to the transconductance device 202. A source 202S of the transconductance device 202 may be coupled to a ground 214, and a drain 206D of the top cascode transistor 206 may be coupled to the output node 210 and a supply voltage 216.

A bias circuit 218 may be coupled to a gate 206G of the top cascode transistor 206. The bias circuit 218 holds the gate 206G at Vout(DC)+Vth as explained above. The bias circuit 218 may determine the appropriate level through replica biasing tracking circuitry (not shown), or the like.

Using the bias circuit 218, the top cascode transistor 206 may be forced into a triode mode purposefully for a set duty cycle to assist in providing a constant capacitance for the first power amplifier stage 200 over a wide power level range. Thus, as shown by graph 300 in FIG. 3, during a first part 302 of an RF cycle 304, the top cascode transistor 206 operates in a saturation mode, but in the other part 306 of the RF cycle 304, the top cascode transistor 206 operates in a triode mode. The bias circuit 218 holds the voltage at the gate 206G (e.g., V(206G)) at Vout(DC)+Vth so that positive RF signals 308 will push the top cascode transistor 206 deeper into saturation, and negative RF signals 310 will push the top cascode transistor 206 into the triode mode.

Figures 4, 5:
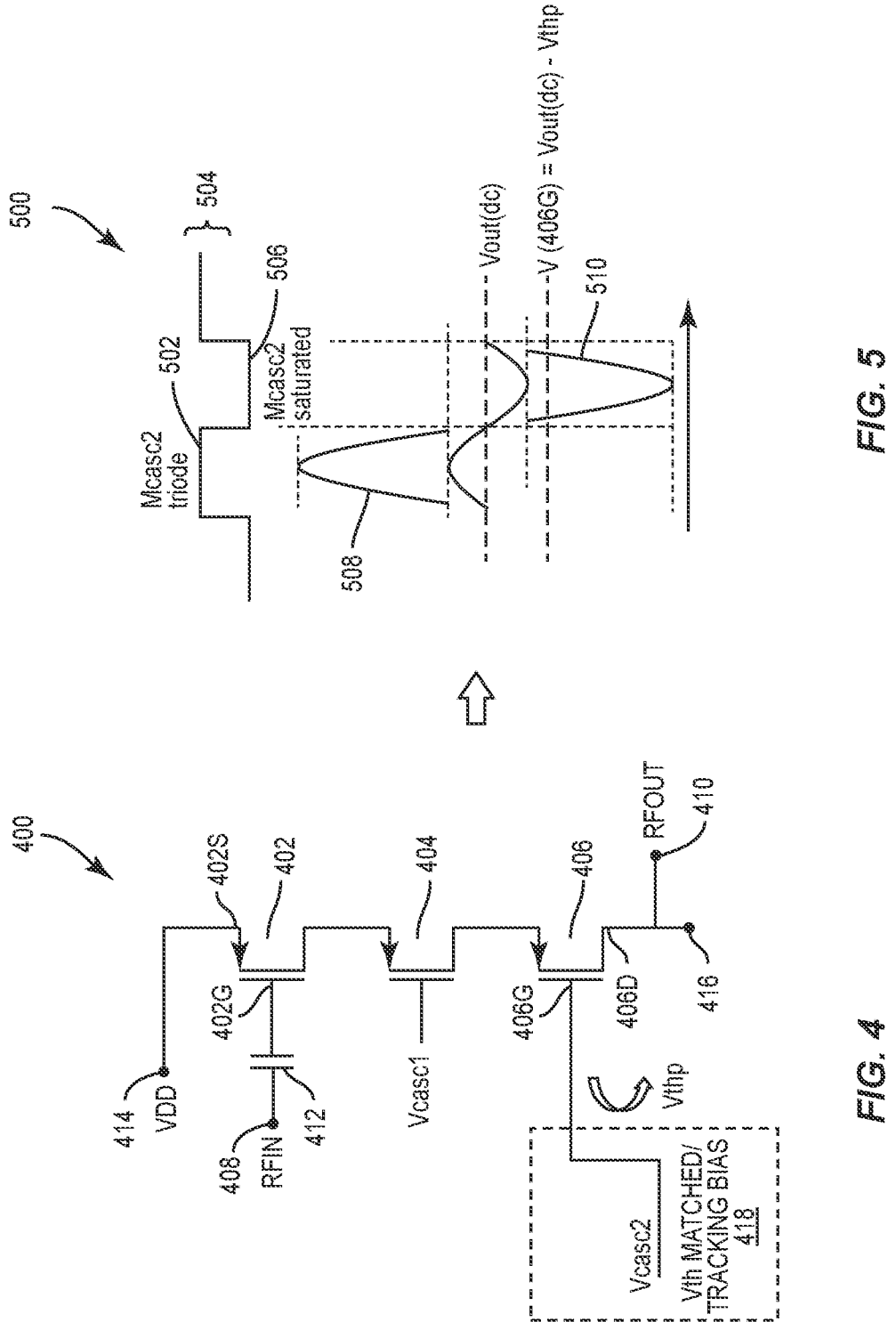
FIG. 4 is a circuit diagram showing a power amplifier stage having a bias circuit that fixes a bias level for a P-type cascode transistor within the power amplifier stage.
FIG. 5 is a graph of the output signal for the power amplifier stage with a fixed duty cycle achieved by the bias circuit of FIG. 4.

FIG. 4 is similar to FIG. 2, but illustrates a power amplifier stage 400 composed of PFETs. The power amplifier stage 400 is formed from a transconductance device 402, a middle cascode device 404, and a bottom cascode transistor 406. A signal to be amplified (e.g., RFIN) is provided at an input node 408 and an amplified signal (RFOUT) is provided at an output node 410. RFIN may pass through a blocking capacitor 412 to a gate 402G of the transconductance device 402. The transconductance device 402 provides the primary amplification to RFIN. The middle cascode device 404 and the bottom cascode transistor 406 are both cascodes relative to the transconductance device 402. A source 402S of the transconductance device 402 may be coupled to a supply voltage (Vdd) 414, and a drain 406D of the bottom cascode transistor 406 may be coupled to the output node 410 and a fixed voltage 416 (e.g., ground).

A bias circuit 418 may be coupled to a gate 406G of the bottom cascode transistor 406. The bias circuit 418 holds the gate 406G at Vout(DC)–Vth. The change from +Vth to –Vth is a function of the difference between NFET and PFET as should be well understood. The bias circuit 418 may determine the appropriate level through replica bias tracking circuitry (not shown), or the like.

Using the bias circuit 418, the bottom cascode transistor 406 may be forced into the triode mode purposefully for a set duty cycle to assist in providing stable capacitance for the power amplifier stage 400. Thus, as shown by graph 500 in FIG. 5, during a first part 502 of an RF cycle 504, the bottom cascode transistor 406 operates in a saturation mode, but in the other part 506 of the RF cycle 504, the bottom cascode transistor 406 operates in a triode mode. The bias circuit 418 holds the voltage at the gate 406G (e.g., V(406G)) at Vout(DC)–Vth so that positive RF signals 508 will push the bottom cascode transistor 406 into the triode mode, and negative RF signals 510 will push the bottom cascode transistor 406 into the saturation mode.

Figures 6, 7A:
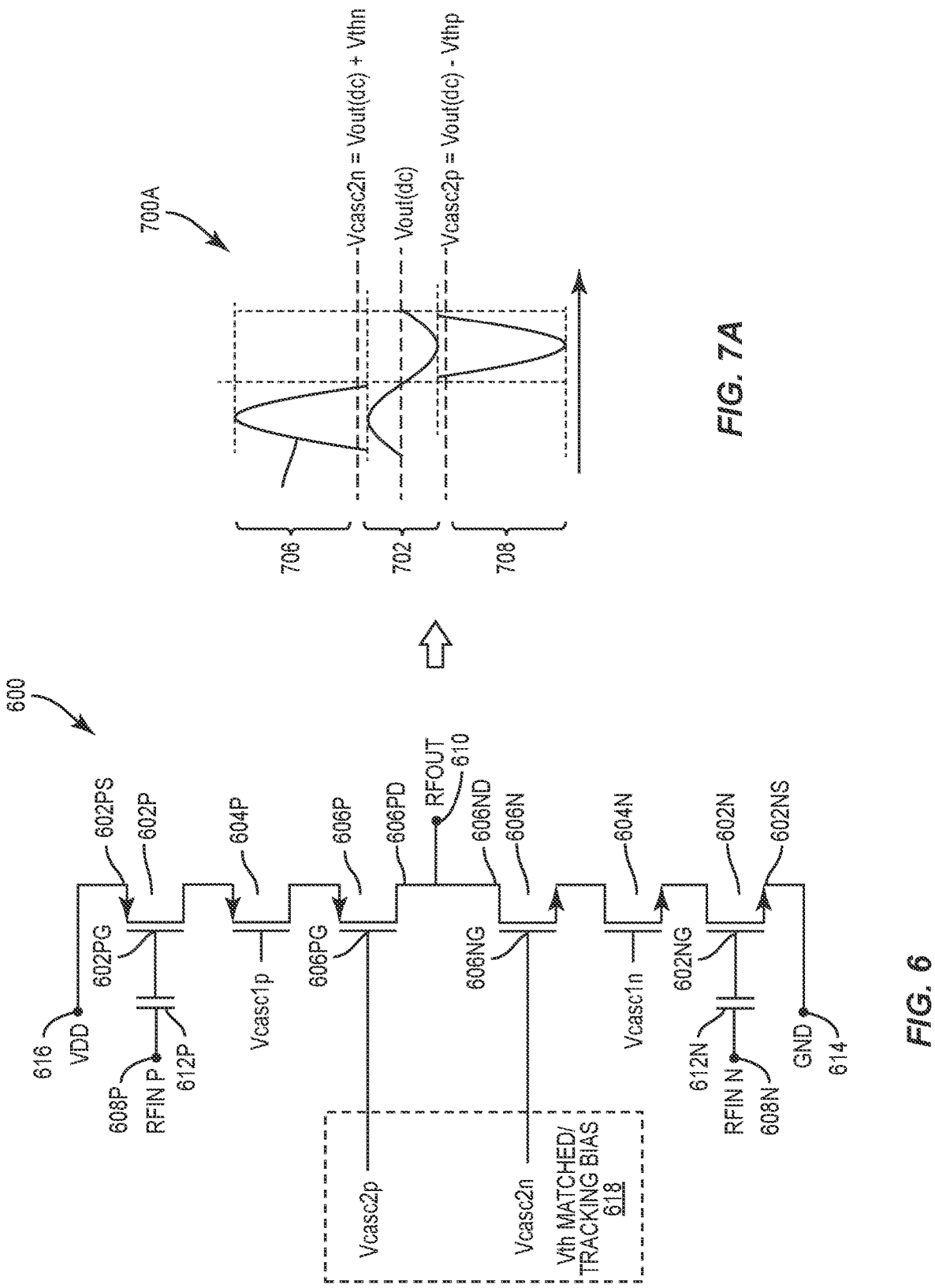
FIG. 6 is a circuit diagram showing a power amplifier stage having a bias circuit that fixes a bias level for cascode transistors in a complementary power amplifier stage.
FIG. 7A is a graph of the output signal for the power amplifier stage with a generalized fixed duty cycle achieved by the bias circuit of FIG. 6.

In addition to single type power amplifier stages such as power amplifier stage 200 or 400, the present disclosure is also applicable to a complementary power amplifier stage that includes both NFETs and PFETs as illustrated in FIG. 6. In this regard, a power amplifier stage 600 is formed from first transconductance devices 602N, 602P, middle cascode devices 604N, 604P, and top/bottom cascode transistors 606N, 606P. A signal to be amplified (e.g., RFINN, RFINP) is provided at input nodes 608N, 608P, and an amplified signal (RFOUT) is provided at an output node 610. RFIN may pass through blocking capacitors 612N, 612P to gates 602NG, 602PG of the respective transconductance devices 602N, 602P. The transconductance devices 602N, 602P provide the primary amplification to RFINN, RFINP. The middle cascode devices 604N, 604P, and the top/bottom cascode transistors 606N, 606P are cascodes relative to the transconductance devices 602N, 602P. Source 602NS of the transconductance device 602N may be coupled to a ground 614. Source 602PS may be coupled to a voltage supply 616 (Vdd). Drains 606ND, 606PD of the cascode transistors 606N, 606P may be coupled to the output node 610.

A bias circuit 618 may be coupled to gates 606NG, 606PG of the cascode transistors 606N, 606P. Note that while illustrated as a single bias circuit 618, it is possible that the bias circuit 618 may be two separate circuits without departing from the present disclosure. The bias circuit 618 holds the gate 606NG at Vout(DC)+Vth and the gate 606PG at Vout(DC)–Vth as explained above. The bias circuit 618 may determine the appropriate level through average replica bias tracking circuitry (not shown), or the like.

Using the bias circuit 618, the cascode transistors 606N, 606P may be forced into the triode mode purposefully for a set duty cycle to assist in providing stable capacitance for the power amplifier stage 600. Thus, as shown by graph 700A in FIGS. 7A, within a first zone 702 of the RF cycle the cascode transistors 606N, 606P operate in a triode or crushed mode, but in the other parts 706, 708 of the RF cycle, the cascode transistors 606N, 606P operate in a saturation mode. The bias circuit 618 holds the voltage at the gate 606NG (e.g., V(606NG)) at Vout(DC)+Vth1 and holds the voltage at the gate 606PG (e.g., V(606PG)) at Vout(DC)–Vth2.

Figure 7B:
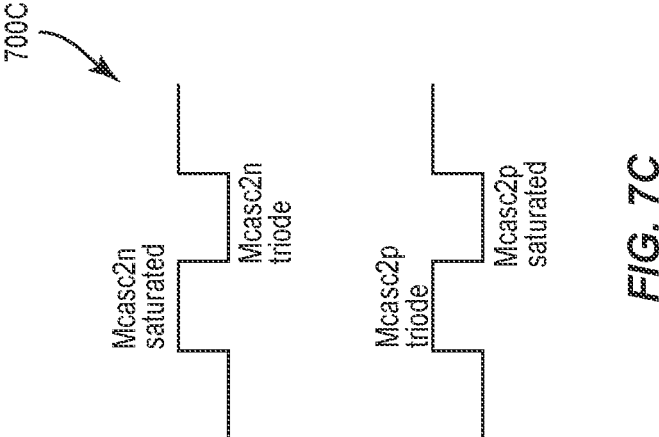
FIG. 7B is a graph of the output signal for the power amplifier stage with a synchronized fixed duty cycle achieved by the bias circuit of FIG. 6.
Figure 7C:
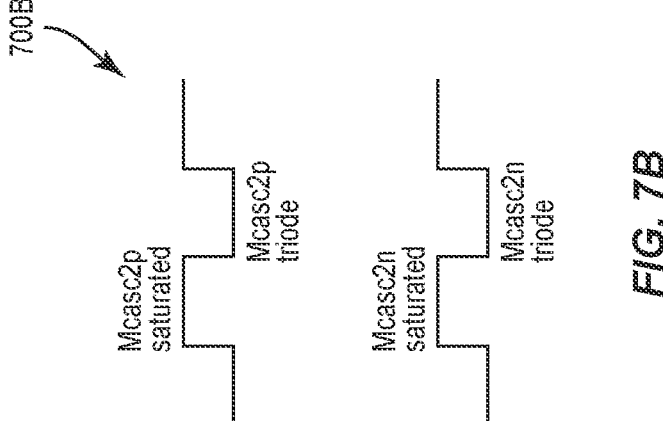
FIG. 7C is a graph of the output signal for the power amplifier stage with an alternating fixed duty cycle achieved by the bias circuit of FIG. 6.

As better illustrated in FIGS. 7B and 7C, it is possible to put the cascode transistors 606N, 606P in the triode mode concurrently as shown by graph 700B in FIG. 7B or they may be put in the triode mode in an alternating fashion as shown by graph 700C in FIG. 7C.

In the case of amplifiers having multiple cascode devices, each cascode device may introduce its own phase distortion when it goes in triode mode, and each cascode may need to have its own method to correct for the phase distortion (AM-PM). The different cascodes of an amplifier may use the same type of method to correct the phase distortion, or it may use different methods to correct the individual phase distortion contributed by different cascode devices.

Figure 8B:
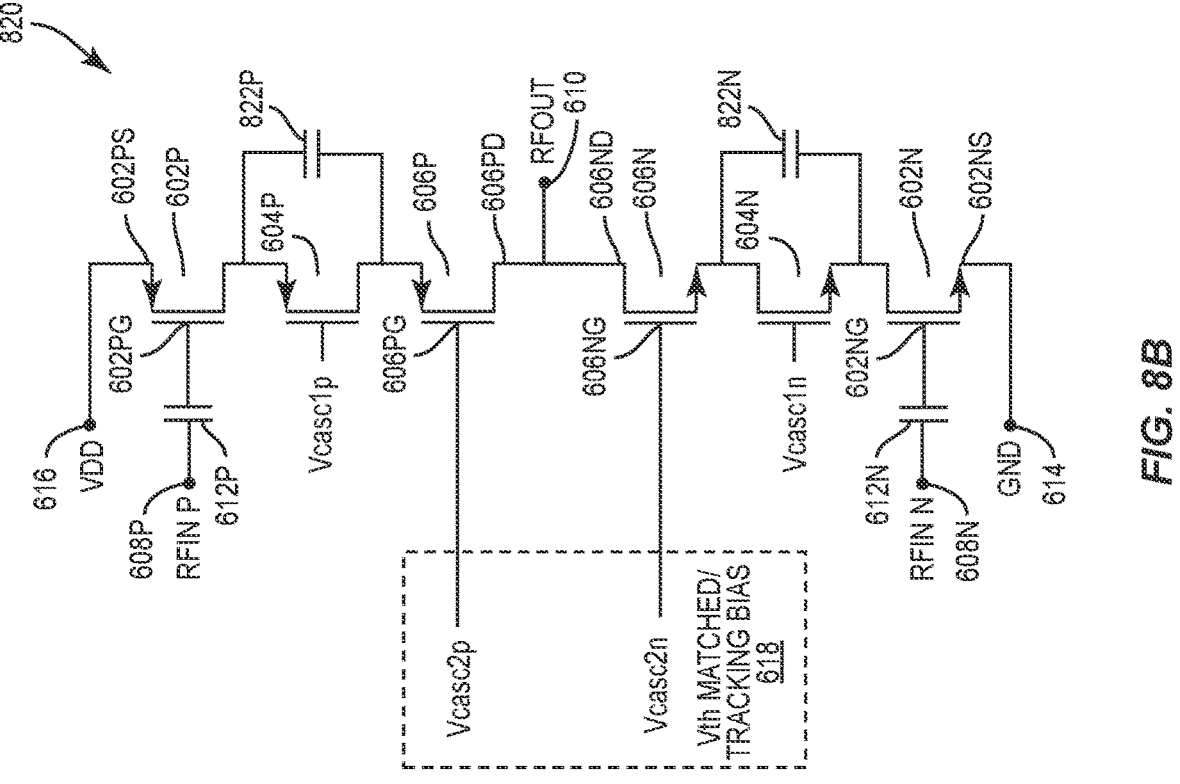
FIG. 8B is a circuit diagram showing a complementary power amplifier stage having two transconductance devices and four cascode devices out of which the middle cascode devices use a parallel drain-to-source capacitance to correct for its phase distortion, while the top/bottom cascode transistors use a fixed triode-to-saturation-mode duty cycle bias technique.
Figure 8A:
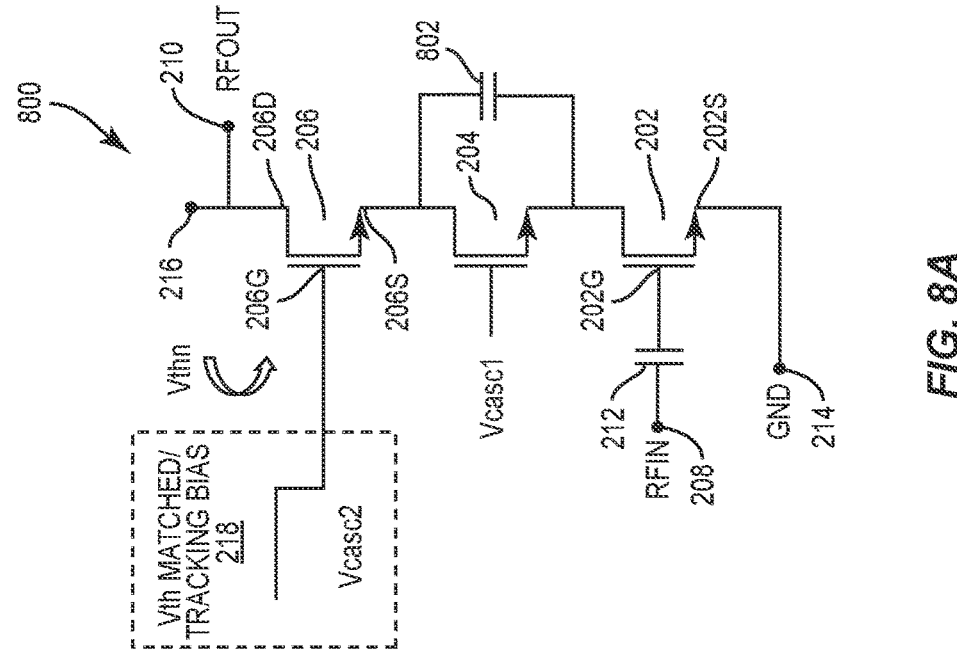
FIG. 8A is a circuit diagram showing a unipolar power amplifier stage having a transconductance device and two cascode devices out of which the middle cascode device uses a parallel drain-to-source capacitance to correct for its phase distortion, while the top cascode transistor uses a fixed triode-to-saturation-mode duty cycle bias technique.

FIG. 8A shows an NFET power amplifier stage 800 using a transconductance device 202, a middle cascode device 204, and a top cascode transistor 206. In addition to the bias circuit 218 which assists the top cascode transistor 206, the middle cascode device 204 uses a parallel capacitance 802 to keep constant its capacitive loading of the signal path as it goes from saturation to triode mode. A similar structure may be used for a PFET-based amplifier.

FIG. 8B shows a complementary power amplifier stage 820 using two transconductance devices (602N and 602P), two middle cascode devices (604N and 604P) and a top cascode transistor 606N and a bottom cascode transistor 606P. The middle cascode devices 604N and 604P use parallel capacitances 822N and 822P to keep constant their capacitive loading of the signal path as it goes from saturation to triode mode, while the top/bottom cascode transistors 606N and 606P use a bias technique that ensures a fixed duty cycle for both saturation and triode mode for all power levels (e.g., 50% duty cycle).

The stacked devices (transistors) of an amplifier may each have their dedicated bias circuit, or the bias circuits of the different stacked devices may be connected one to the other such that their voltages are linked with specific mathematical relations or expressions.

Figure 9B:
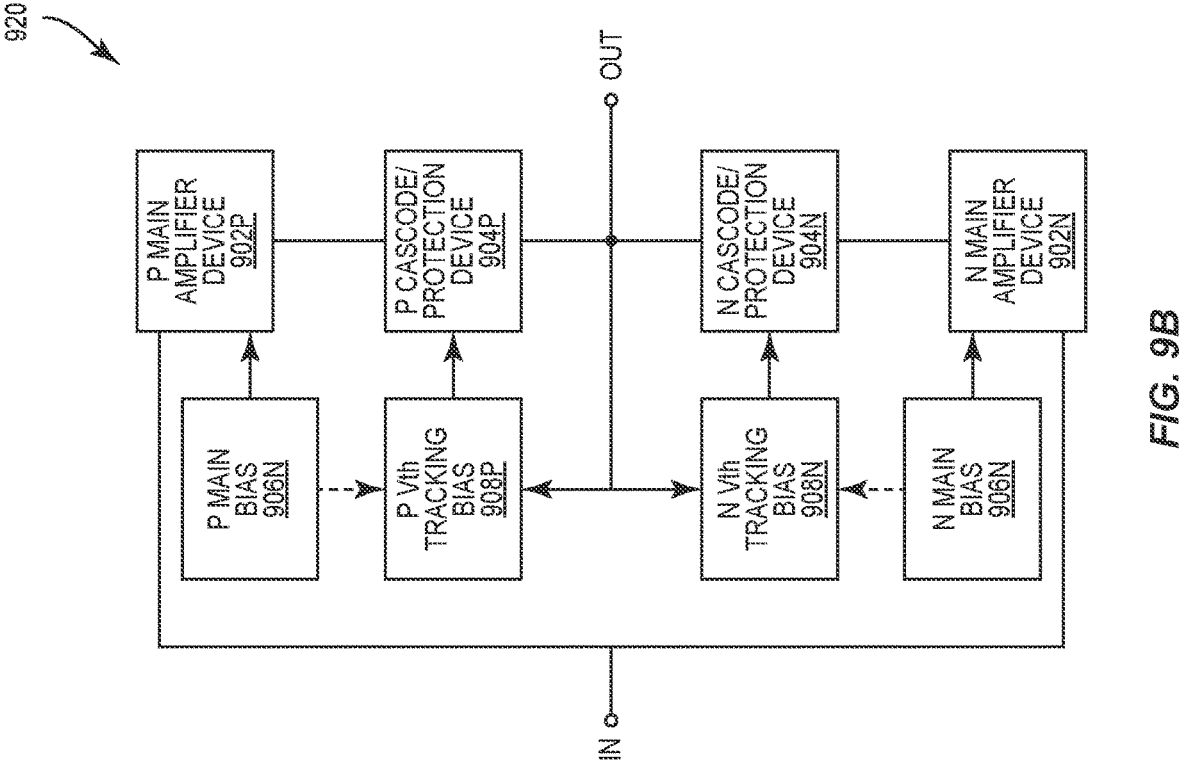
FIG. 9B is a block diagram of a complementary power amplifier stage showing the bias circuits of the transconductance devices and cascode devices connected such that the cascode devices operate with a fixed duty cycle of a saturation-to-triode-mode operation.
Figure 9A:
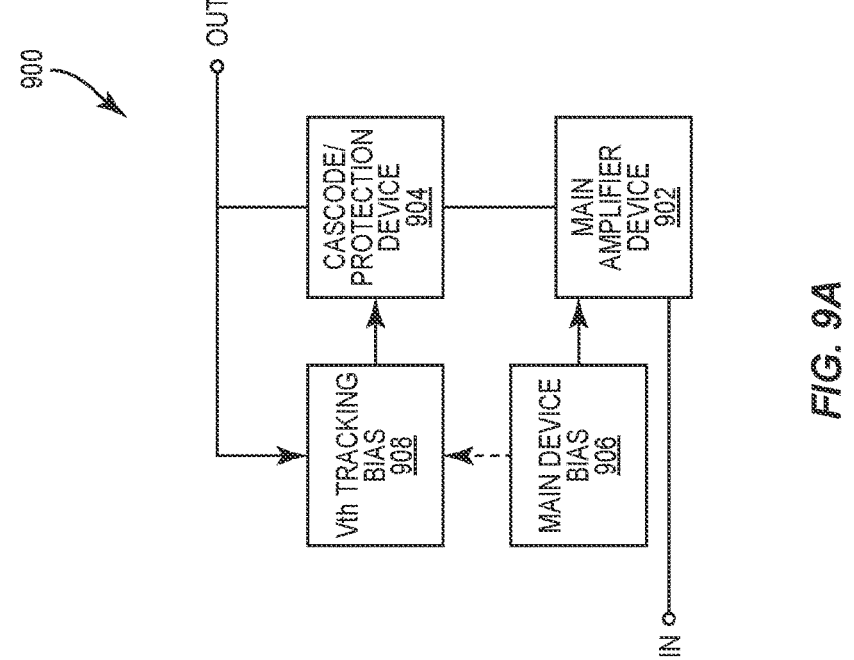
FIG. 9A is a block diagram of a power amplifier stage showing the bias circuits of the transconductance device and cascode devices, connected such that the cascode devices operate with a fixed duty cycle of a saturation-to-triode-mode operation for a single material type.

FIG. 9A shows a block diagram of an amplifier 900 that abstracts the structures shown in previous figures. Specifically, the amplifier 900 may be of a single material type (i.e., NFETs or PFETs) and include a main amplifier device 902 with stacked cascode protection device(s) 904. The main amplifier device 902 may be coupled to a main device bias circuit 906. Likewise, the stacked cascode protection device(s) 904 may be coupled to a threshold tracking bias circuit 908 that biases the stacked cascode protection device(s) 904 such that the stacked cascode protection device(s) 904 operate in a triode (crushed) mode for a fixed duty cycle.

FIG. 9B shows a similar block diagram for an amplifier 920 that can be with complementary devices (both NFET and PFET). As with the amplifier 900 of FIG. 9A, the amplifier 920 may include main amplifier devices 902N, 902P with stacked cascode protection devices 904N, 904P. The main amplifier devices 902N, 902P may be coupled to main device bias circuits 906N, 906P. Likewise, the stacked cascode protection devices 904N, 904P may be coupled to threshold tracking bias circuits 908N, 908P that bias the stacked cascode protection devices 904N, 904P such that the stacked cascode protection devices 904N, 904P operate in a triode (crushed) mode for a fixed duty cycle).

Figures 10A, 10B, 10C:
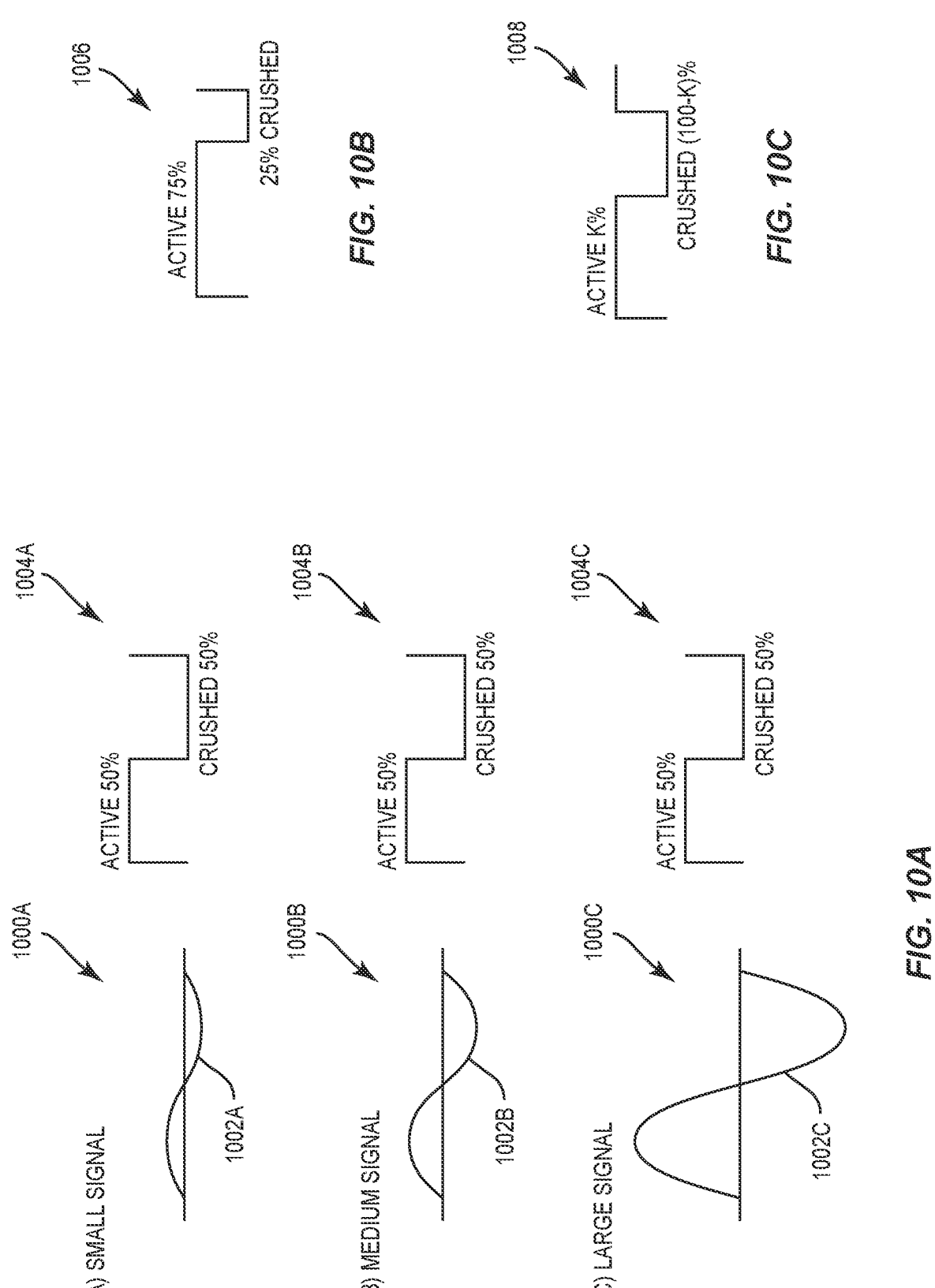
FIG. 10A illustrates a fixed 50% duty cycle of saturation-to-triode-mode operation regardless of signal magnitude.
FIGS. 10B and 10C show alternate duty cycles of saturation-to-triode-mode operation.

FIG. 10A shows graphs 1000A-1000C where regardless of the size of the signals 1002A-1002C, the duty cycles 1004A-1004C are always constant, and, as illustrated are 50%.

FIGS. 10B and 10C show alternate possible duty cycles 1006 and 1008, respectively. Duty cycle 1006 may be in the active (saturation) mode 75% and crushed (triode) mode 25%. More generically, the duty cycle 1008 may be active for k % and crushed (100-k) %.

While the examples of the power amplifier stages are illustrated using a single cascoded stage, the teachings of the present disclosure are not so limited. The teachings of the present disclosure may also be applied to power amplifier stages formed from larger stacks of cascoded FETs, complementary metal oxide semiconductor (CMOS) FET arrangements (e.g., power amplifier stage 600), bulk CMOS devices, silicon on insulator (SOI) CMOS devices, silicon on sapphire (SOS) CMOS devices, or the like. The SOI CMOS devices may be partially- or fully-depleted. Additionally, the transistors may be junction-gate FETs (JFETs), pseudomorphic high electron mobility transistors (PHEMTs) or the like. While all the examples provided are single-ended devices, it should also be appreciated that the concepts of the present disclosure are applicable to differential, quadrature or other devices. The stages may be combined in Doherty, hybrid combining or out-phasing fashion.

Still further, aspects of the present disclosure may be applied to a power amplifier device that has multiple stages such as a driver stage and an output stage with or without an intermediate boosting stage.

Likewise, while the present disclosure focuses on a 50-50 duty cycle, it should be appreciated that the present disclosure contemplates any situation that has a bias circuit holding the duty cycle fixed for all signal levels.

Those skilled in the art will recognize improvements and modifications to the preferred embodiments of the present disclosure. All such improvements and modifications are considered within the scope of the concepts disclosed herein and the claims that follow.

What is claimed is:

1. A power amplifier stage comprising: a cascode transistor comprising a gate; and a bias circuit coupled to the gate, the bias circuit configured to hold a voltage level at the gate equal to a drain voltage plus the device threshold voltage of the cascode transistor such that entry of the cascode transistor into the triode mode is controlled to a fixed duty cycle to maintain a constant average capacitance.

2. The power amplifier stage of claim 1, wherein the cascode transistor comprises a field effect transistor (FET).

3. The power amplifier stage of claim 2, further comprising a transconductance device and a middle cascode device, wherein the cascode transistor and the middle cascode device are cascodes relative to the transconductance device.

4. The power amplifier stage of claim 2, wherein the FET comprises an n-type FET (NFET).

5. The power amplifier stage of claim 4, wherein a gate voltage modified by the device threshold voltage comprises a drain voltage summed with the device threshold voltage.

6. The power amplifier stage of claim 2, wherein the FET comprises a p-type FET (PFET).

7. The power amplifier stage of claim 6, wherein a gate voltage modified by the device threshold voltage comprises the device threshold voltage subtracted from a drain voltage.

8. The power amplifier stage of claim 2 implemented in a bulk complementary metal oxide semiconductor (CMOS) device.

9. The power amplifier stage of claim 2 implemented in a silicon on insulator (SOI) complementary metal oxide semiconductor (CMOS) device.

10. The power amplifier stage of claim 2 implemented in a silicon on sapphire (SOS) complementary metal oxide semiconductor (CMOS) device.

11. The power amplifier stage of claim 1, wherein the bias circuit is configured to operate the cascode transistor in a triode mode for a fixed duty cycle.

12. The power amplifier stage of claim 11, wherein the fixed duty cycle is 50%.

13. The power amplifier stage of claim 1, further comprising a second cascode transistor and wherein the bias circuit is configured to operate the cascode transistor in a triode mode for 50% of a radio frequency (RF) cycle and operate the second cascode transistor in the triode mode for another 50% of the RF cycle.

14. The power amplifier stage of claim 3, further comprising a drain-to-source parallel capacitance for the middle cascode device.

15. A radio frequency (RF) circuit comprising:
   a cascode power amplification stage comprising a cascode gate and an output node; a threshold voltage bias stage matched to the cascode power amplification stage and configured to keep the cascode gate within one threshold voltage from a direct current (DC) voltage level of the output node such that the cascode power amplification stage is at a verge of entering a triode operation; and a bias circuit configured to hold a voltage level at the gate equal to a drain voltage plus the device threshold voltage of the cascode transistor such that entry of the cascode transistor into the triode mode is controlled to a fixed duty cycle to maintain a constant average capacitance.

16. The RF circuit of claim 15, wherein the cascode power amplification stage stays in the triode operation for a fixed duty cycle for all signal levels.

17. The RF circuit of claim 16, wherein the fixed duty cycle is 50%.

18. The RF circuit of claim 15, wherein two cascode devices are alternatively operating in the triode operation.

19. The RF circuit of claim 18, wherein an n-type field effect transistor (FET) (NFET) is in the triode operation for 50% of an RF cycle and a p-type FET (PFET) is in the triode operation for the other 50% of the RF cycle.

20. A power amplifier stage comprising:
   a cascode transistor comprising a gate, a drain, and a source, the cascode transistor having a device threshold defined as a difference between a gate voltage and a drain voltage that causes the cascode transistor to enter a triode mode of operation from a saturation mode of operation; and
   a bias circuit coupled to the gate, the bias circuit configured to hold a voltage level at the gate equal to a drain voltage plus the device threshold voltage of the cascode transistor such that entry of the cascode transistor into the triode mode is controlled to a fixed duty cycle to maintain a constant average capacitance.

* * * * *